United States Patent
Besio et al.

(10) Patent No.: US 7,158,000 B2
(45) Date of Patent: Jan. 2, 2007

(54) MAGNET STRUCTURE FOR NUCLEAR MAGNETIC RESONANCE IMAGING APPARATUS

(75) Inventors: Stefano Besio, Genoa (IT); Davide Carlini, Genoa (IT); Alessandro Trequattrini, Genoa (IT); Stefano Pittaluga, Genoa (IT)

(73) Assignee: Esaote, S.p.A., Casale Monferrato (IT)

( * ) Notice: Subject to any disclaimer, the term of this patent is extended or adjusted under 35 U.S.C. 154(b) by 40 days.

(21) Appl. No.: 10/813,262

(22) Filed: Mar. 31, 2004

(65) Prior Publication Data
US 2004/0263301 A1 Dec. 30, 2004

(30) Foreign Application Priority Data
Mar. 31, 2003 (IT) .......................... SV2003A0011

(51) Int. Cl.
*H01F 1/00* (2006.01)
(52) U.S. Cl. ...................................... 335/296; 335/216
(58) Field of Classification Search ........ 335/296–299, 335/302–306, 216
See application file for complete search history.

(56) References Cited

U.S. PATENT DOCUMENTS

| | | | | |
|---|---|---|---|---|
| 4,818,966 A | * | 4/1989 | Miyamoto et al. .......... 335/296 |
| 5,124,651 A | * | 6/1992 | Danby et al. ............... 324/318 |
| 5,555,251 A | | 9/1996 | Kinanen |
| 6,150,818 A | * | 11/2000 | Barber ........................ 324/319 |
| 6,586,936 B1 | | 7/2003 | Pittaluga et al. |

\* cited by examiner

Primary Examiner—Elvin Enad
Assistant Examiner—Bernard Rojas
(74) Attorney, Agent, or Firm—Buchanan Ingersoll & Rooney, PC

(57) ABSTRACT

A magnet structure for a Nuclear Magnetic Resonance imaging apparatus includes at least two opposing magnetic pole pieces, which are located at a certain distance from each other and delimit an imaging region. The pole pieces are formed by at least one massive layer of a magnetically permeable material, and at least one layer of magnetically permeable material having a pack of superimposed sheets or foils, electrically insulated from each other. Each of the sheets has cuts arranged over the surface of the sheet in positions that are at least partly non coincident with the cuts of at least one, or both adjacent sheets. The magnetically permeable sheets or foils have a first face and a second face and the cuts are so arranged on each sheet that the cuts of a sheet or foil are offset and not coincident with respect to the cuts of an adjacent sheet or foil, when said adjacent sheet is laid over the previous sheet in an overturned position, i.e. with the first face turned toward the first face of the first sheet or with the second face of said adjacent sheet turned toward the second face of the first sheet.

31 Claims, 9 Drawing Sheets

MAGNET STRUCTURE FOR NUCLEAR MAGNETIC RESONANCE IMAGING APPARATUS

FIELD OF THE INVENTION

The invention relates to a magnet structure for a Nuclear Magnetic Resonance imaging apparatus and the fabrication thereof. More particularly the invention relates to a magnet structure having at least two opposed pole pieces, which are located at a certain distance from each other and delimit an imaging region, wherein the pole pieces are formed by at least one massive layer of a magnetically permeable material, and at least one layer of magnetically permeable material comprising a pack of superimposed sheets or foils, electrically insulated from each other, each sheet having cuts arranged over the surface of the sheet in positions that are at least partly non coincident with the cuts of at least one, or both adjacent sheets.

BACKGROUND OF THE INVENTION

Several different types of magnet structures are known that have the above construction. U.S. Pat. No. 5,555,251 discloses a magnet structure which has two pole pieces having a massive ferromagnetic layer and a layer made of laminated ferromagnetic foils or sheets. In this arrangement, sheets are made of one piece and have a number of radial cuts, arranged from a center of the sheet. The sheets have a circular shape, coaxial with the center around which the cuts are radially arranged. All the sheets have the same shape and the same pattern of cuts.

The cuts of each sheet are offset with respect to an adjacent sheet by rotating each sheet relative to the adjacent sheet by an angle smaller than the angular distance between two successive radial cuts.

As a result, in order to form the laminated layer of each pole piece, the sheets must be properly offset before being bonded together by an adhesive layer or an electric insulating and adhesive layer which coats the sheets. While the assembly of the laminated layer is intrinsically simple, it is still dependent on the position of the sheets relative to each other, and this is a parameter to be accounted for during manufacture of the pole pieces. Moreover, this may generate errors in the angular positioning of the sheets.

Also, due to the one-piece construction of the sheets, handling problems may arise when the sheets, as well as the pole pieces have a relatively large size. An additional problem consists in that that the sheets that require a high dimensional precision and are made of a special magnetically permeable material are generally not fabricated of sufficiently large sizes, and any size increase thereof would involve a considerable cost increase. In this case, the provision of one-piece sheets is not feasible or involves higher costs for the magnet structure.

The invention is based on the problem of providing a magnet structure as described hereinbefore which, thanks to simple and inexpensive arrangements, allows easier handling, particularly for the fabrication of large-sized magnets, and helps to obviate the above drawbacks.

OBJECTS AND SUMMARY

An embodiment of the invention solves the above problems by providing a magnet structure as described hereinbefore, wherein the magnetically permeable sheets or foils have a first face and a second face and the cuts have such a width and such a length and are so arranged on each sheet, that the cuts of a sheet or foil are offset and not coincident with respect to the cuts of the adjacent sheet or foil, when said adjacent sheet lies over the previous sheet in an overturned position, i.e. with the first face turned toward the first face of the first sheet or with the second face of said adjacent sheet turned toward the second face of the first sheet.

In accordance with an embodiment of the invention, each sheet may be divided into two halves along an axis parallel to a sheet overturning axis, about which each successive sheet is overturned by 180° relative to the adjacent preceding sheet of the layer of sheets of each pole piece. In this embodiment, an identical cut pattern may be provided for all sheets, which pattern differs in cut arrangement, orientation, length, and/or width in the two halves of each sheet such that, when two sheets are superimposed in a mutually overturned or reversed condition, i.e. with the first faces or the second faces of said two sheets facing toward each other, the cuts of a first sheet are disposed in offset positions with respect to the cuts of the second sheet in both halves of the adjacent sheets.

As a result, identical sheets may be provided for each layer, and each superimposed sheet needs simply be overturned with respect to the underlying sheet of a pack of sheets that forms the non massive layer of a pole piece of the magnet structure.

Particular advantageous embodiments will be described in greater detail in the following description and will form the subject of specific subclaims.

Cuts may be arranged according to a few rules that simplify both the cut pattern design and the actual cut forming process.

A first rule may consist in disposing cuts along parallel axes, forming a set of parallel axes, the sets of axes on the first and second halves of the sheet being oriented parallel to each other and to an overturning axis, and there being provided a distance of the first axis of each set of axes from the center axis of the sheet, which is parallel to or coincident with the overturning axis, said distance being different for the sets of axes on the first half and on the second half of the sheet respectively.

Cuts may be continuous or discontinuous along the corresponding positioning axis of the set of parallel positioning axes. Discontinuous cuts form whole portions or bridges of sheet material along cut positioning axes.

According to a variant, as shown in FIGS. 1 to 3, the sets of cut positioning axes on the two sheet halves have an inclined, symmetrically divergent or convergent orientation, for the first and second sheet halves, with respect to the center axis of the sheet, which is parallel to or coincident with the sheet overturning axis, the intersection points of the set of parallel arrangement axes on the first sheet half with said center axis being provided in intermediate positions between the intersection points of the set of parallel positioning axes of the second sheet half. Also, the intersection points of the two sets of parallel cut (2, 2') positioning axis on the first and second halves (202, 302) of the sheet (2, 2') may be interleaved and equally spaced along the center axis, which is parallel to or coincident with the overturning axis.

According to another variant, the sets of cut positioning axes on the two sheet halves have an inclined orientation with respect to the center axis of the sheet, which is parallel to or coincident with the sheet overturning axis, the intersection points between the set of parallel positioning axes on the first half of the sheet and said center axis being situated in intermediate positions with respect to the intersection points between the positioning axes of the set of parallel positioning axis of the second sheet half and said center axis, and each cut along each positioning axis being discontinuous and forming an unbroken sheet portion, the succession of the unbroken sheet portions and of the cut parts along the positioning axes being inverted from the first half to the second half of the sheet, whereas the pitch of the cuts and unbroken portions along each arrangement axis is such that, when the first sheet half is overturned against the second sheet half, the cuts along each positioning axis of the first sheet half intersect the cuts along each positioning axis of the second sheet half at unbroken portions, and vice versa.

No restriction is provided to patterns and shapes of cuts. It shall be further noticed that the pattern is only conceived on one of the ideal halves of the sheet, this pattern defining the cut-free portions of the same half, hence the position of cuts in the second half, considering that, by overturning the sheet, pattern orientation will be symmetrically reversed with respect to the overturning axis and/or to the center axis that ideally divides the sheet in halves.

The above arrangement allows to conceive cut patterns in which the direction and arrangement of cuts varies as a function of the orientation of the turns or conductors of one or more possible gradient coils associated to the magnet structure, as is typical in Nuclear Magnetic Resonance imaging apparatus.

When cut patterns on the sheets provide a repeated, orderly and recurring cut arrangement, cuts may be simply formed on the two ideal halves of the sheet, by suitably offsetting the pattern used on one ideal sheet half, in one or two directions subtending the plane that contains the sheet and/or also in a possible direction of rotation or combination of said displacements, with respect to the second sheet half, such that, when said second half is overturned and laid over the first ideal half of an underlying sheet, the cuts of the second ideal half coincide with the cut-free portions of said first ideal half of the underlying sheet and vice versa.

One variant of the cut arrangement pattern on the sheets consists in a radial arrangement thereof from a center, an identical angular distance being provided between individual radial lines along which cuts are provided and the cuts forming a half ring of cuts on each ideal sheet half, whereas the half ring on the second ideal sheet half is rotated with respect to the half ring on the first ideal sheet half to such an extent that when two adjacent sheets are in the superimposed, overturned condition, the cuts of the two ideal halves of a sheet are disposed coincident with the radial intermediate portions between the cuts of the two ideal halves of the adjacent sheet.

According to an additional variant embodiment, each ideal sheet half is divided into a plurality of regions by sets of crossed cuts, i.e. sets of cuts having different orientations, which are broken at crossing areas to form bridges of material that connect together the sheet regions, the crossed sets of parallel cuts on the second ideal sheet half being offset, relative to said second half with respect to the arrangement in the first ideal sheet half, and to such an extent and in such directions that the bridges of material that connect the different areas fall within regions of an adjacent sheet.

Such cut pattern is derived from and detailed in patent application SV2000A0000023, published by the owner hereof.

According to another embodiment of the invention, when the sheet material is not available in sizes large enough to form each sheet from one piece or when the sheet has a too large size to allow a sufficiently easy handling thereof in the one-piece construction, the invention provides that each sheet be formed by at least two adjacent sheet parts, separated by a parting line, said parting line being provided in eccentric position and/or orientation with respect to the separation axis between the two sheet halves, such that the parting lines between the parts of two superimposed adjacent sheets do not coincide.

The parting line between the two sheet parts extends in a cut-free portion, so that said parting line does not intersect any cut on the sheet and/or possibly on one or two adjacent sheets.

Obviously, such arrangement is not limited to the manufacture of sheets that are only formed by two adjacent parts, but may be also extended to sheets formed by three or more adjacent parts.

Thanks to the above arrangements, by using a single sheet type, either having a one-piece construction or formed by two or more adjacent parts, a simple alternate, overturned arrangement of adjacent sheets in the pack, provides a magnetically permeable layer formed by a pack of sheets or foils, which has cuts in offset positions from one sheet to the other in the pack, and such as to effectively suppress eddy currents produced in the pole pieces.

During the assembly, there is no need to account for a precise offset size between superimposed sheets, as the sheet simply needs to be overturned or reversed each time before disposing it on the sheet pack. Such operation is considerably simplified by the fact that the sheets of a pack generally have substantially or precisely the same plan size, whereby the sheets may be aligned in the proper position by simply aligning the peripheral edges thereof.

Fabrication of sheets or foils is also considerably simplified by providing a repetitive cut pattern on each half. Hence, after forming the cuts of the first half, the second half may be treated in much the same manner, by simply offsetting the second half along a predetermined path of the cutting tools used to form the cuts in said first half. The rotational and/or translational offset in one and/or two perpendicular directions, subtending a plane parallel to the sheet surface is determined according to the above description regarding the arrangement of cuts in the two sheet halves. This considerably simplifies sheet fabrication.

Regarding the parting lines or cuts, these are simply made by trimming adjacent edges of two adjacent sheet parts.

BRIEF DESCRIPTION OF THE DRAWING FIGURES

The characteristics of the invention and the advantages derived there from will appear more clear from the following description of non limiting embodiments, illustrated in the annexed drawings, in which.

DETAILED DESCRIPTION OF THE PREFERRED EMBODIMENT

Figure 19:
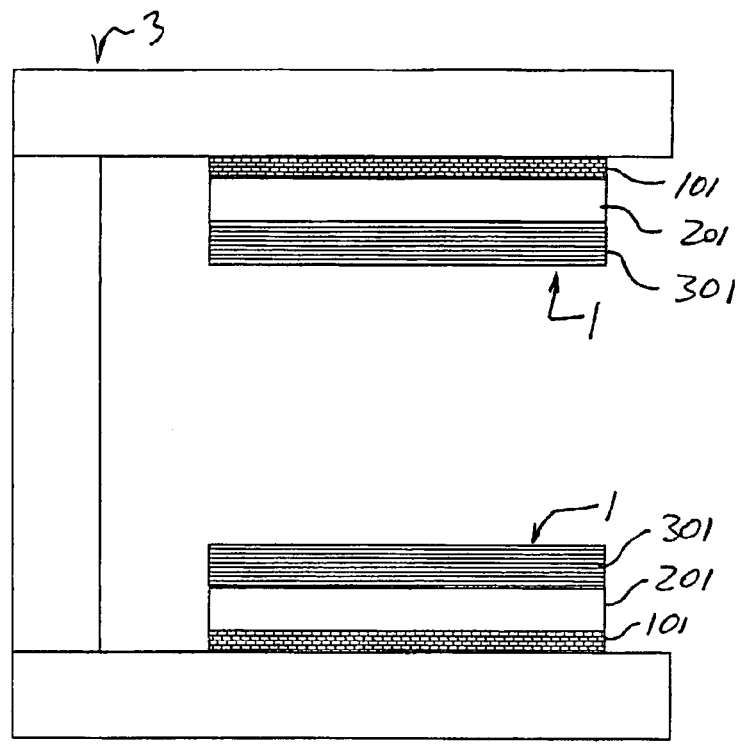
FIG. 19 shows a cross section of a magnet structure according to an embodiment of the invention.

Referring to FIG. 19, a magnet structure of a Nuclear Magnetic Resonance imaging apparatus has two opposing pole pieces 1, between which a static magnetic field is generated. Each pole piece is composed of magnetic field generating means, here a layer of magnetized material 101, a magnetically permeable layer laying over the face thereof turned toward the opposite pole piece, e.g. a ferromagnetic layer, or the like.

Said layer is in turn composed of a massive layer, denoted 201, an additional layer 301 further laying over it, which layer consists of superimposed magnetically permeable sheets or foils 2, which form a pack of sheets, pressed tightly together.

The pole pieces are supported and/or enclosed by a structure, also made of a magnetically permeable material, which has the additional function of closing the magnetic field between the pole pieces, which structure or yoke is generally denoted 3. The structure that is shown in FIG. 19 is a typical structure having an inverted U or C shape. However, the architecture of the structure is not relevant for the purpose of this invention, which applies to the pole pieces of any magnet structure.

Within the permeable material of the pole pieces, eddy currents are induced, which are preferably suppressed or drastically reduced, whereby the layer 301 is formed by alternate superimposed sheets 2, 2', each having a number of cuts 102, 102', arranged in various patterns over the sheet surface.

Nevertheless, advantages are obtained if cuts 102, 102' are not in coincident positions within the pack of superimposed sheets 2, 2'.

Figure 1:
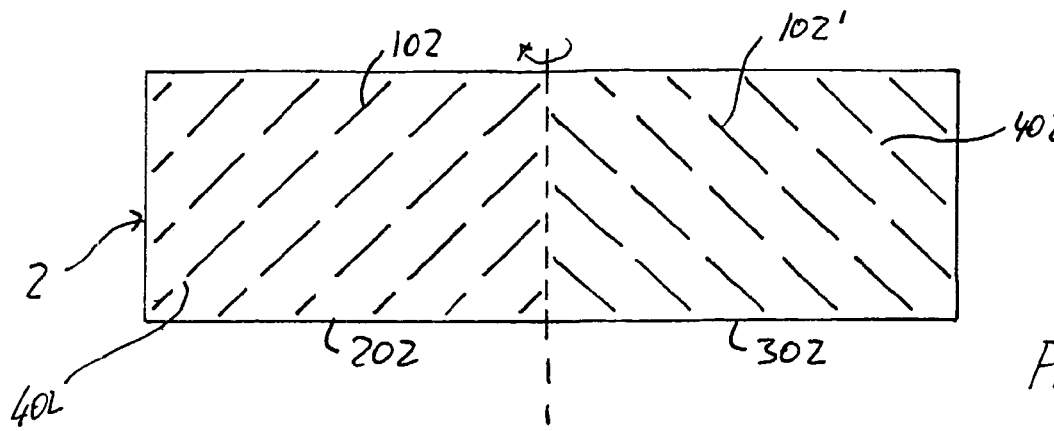
FIG. 1 shows a plan view of a first sheet for use in a magnet structure according to a first embodiment of the invention.
Figure 2:
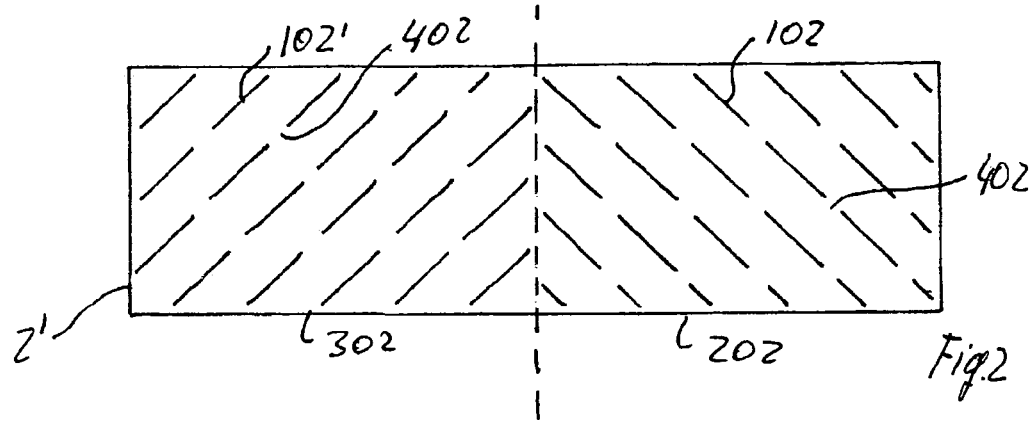
FIG. 2 shows a plan view of a second sheet in the overturned position for use in a magnet structure according to a first embodiment of the invention.
Figure 3:
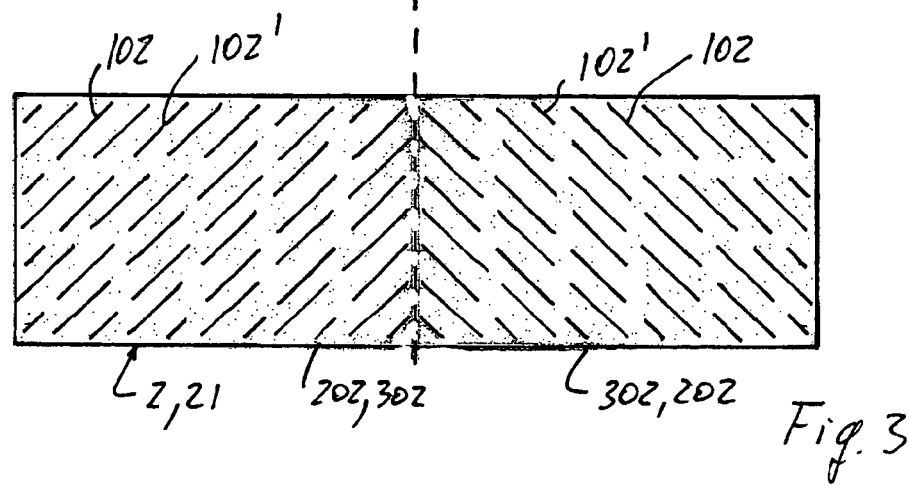
FIG. 3 shows the first and second sheets of FIGS. 1 and 2 in a superimposed position according to a first embodiment of the invention.

According to a first embodiment, as shown in FIGS. 1 to 3, the invention provides identical sheets, each having different arrangement patterns on the two halves 202, 302 of its surface. The pattern of cuts on the two halves are arranged such that, by laying one sheet 2 of the pack of sheets over an identical sheet, after overturning it, as if by leafing through a book, the cuts 102, 102' of the sheets 2, 2' that form the pack of sheets are not coincident, except for one possible, tolerable intersection point.

In practice, if the two faces of a sheet are defined as a first face or front face and second face, or rear face, in the succession of superposed sheets which form the pack, underlying sheets do not adhere by their front face against the rear face of the sheet lying over them, but are overturned, with the front face turned toward the front face of the underlying sheet and adhering against it.

FIG. 1 shows a cut arrangement pattern according to a first embodiment of the invention. The cuts 102 on one of the two halves 202 of the sheet 2 are oriented to form a set of equally spaced, parallel axes, having a predetermined inclination with respect to a general overturning axis of the sheet 2, here conveniently shown coincident with the center axis. On the other half 302 of the sheet 2, the pattern of cuts 102' is not only rotationally symmetric with regard to the inclination of the set of parallel axes, but the set of parallel axes is offset along the central overturning axis to a predetermined extent, which may be equal to half the distance between two parallel axes.

Therefore, the pack is formed as follows:

Over the sheet 2 of FIG. 1, an additional identical sheet is laid in an overturned position, which sheet is shown in FIG. 2 and is denoted 2', with the cuts thereon being denoted 102'.

The cut arrangement resulting from such superimposition is shown in FIG. 3. Obviously, the cuts 102, 102' of the underlying sheet are not visible in actual conditions.

The pack of sheets that forms the layer 301 is formed by an alternation of sheets 2, having a position like that shown in FIG. 1 and sheets 2', having the overturned position as shown in FIG. 2.

As is apparent from the above description, the pack of sheets is thereby easily formed. In fact, the pack is formed by superimposing several sheets 2, 2' having the same pattern of cuts 102, alternately in the two positions described above, i.e. with the front face turned toward the pack and with the front face turned in the direction opposite to the pack.

Figure 20:
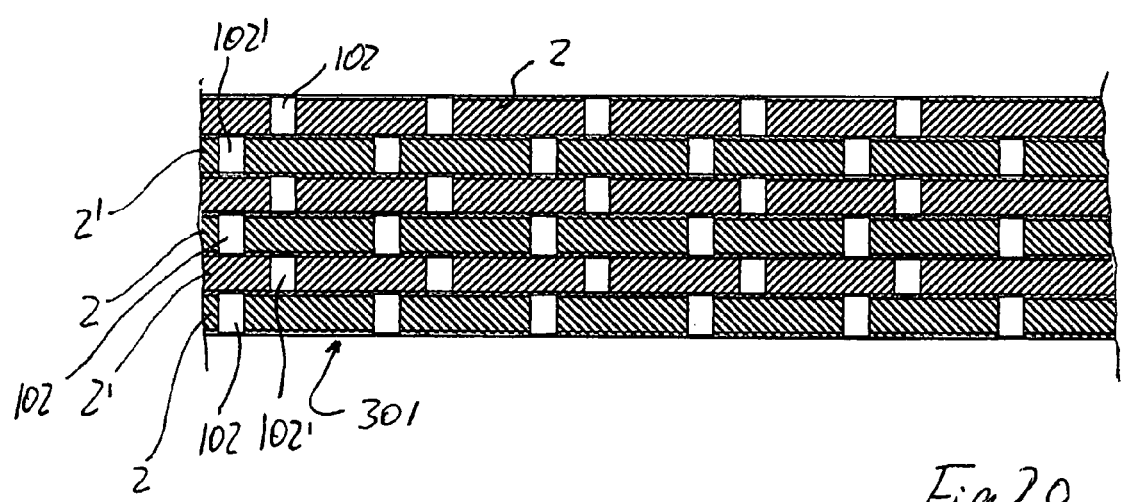
FIG. 20 shows a detail of a section of the layer formed by the sheets of the magnet structure pole piece.

As is clearly shown in FIG. 20, which is a simplified and enlarged sectional view of a pack of sheets 2, 2', the cuts 102, 102' are disposed on each sheet in an offset position with respect to those of the preceding sheet. Any sheet laid over the pack will have cuts 102 offset with respect to those of the directly underlying sheet 2' but coincident with those of the sheet 2 underlying said directly underlying sheet in the pack of sheets.

Figure 4:
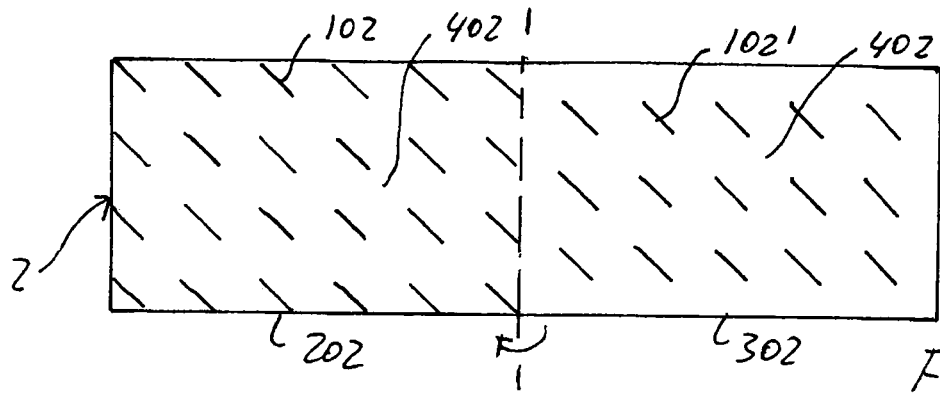
FIG. 4 shows a plan view of a first sheet comprising an alternative pattern of cuts.
Figure 5:
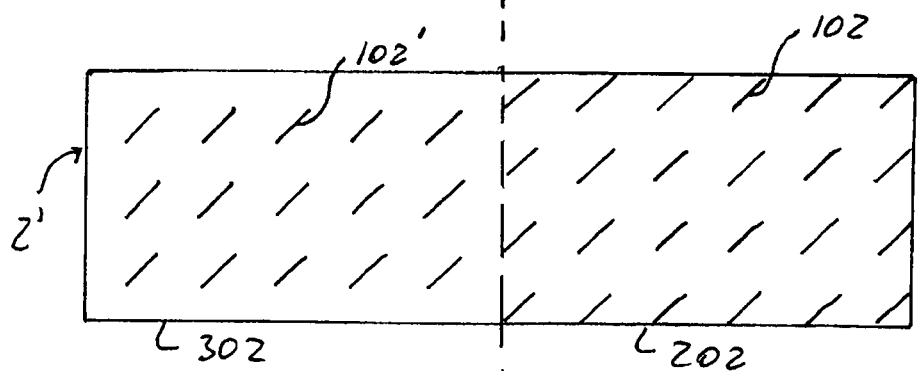
FIG. 5 show a plan view of a second sheet in the overturned position.
Figure 6:
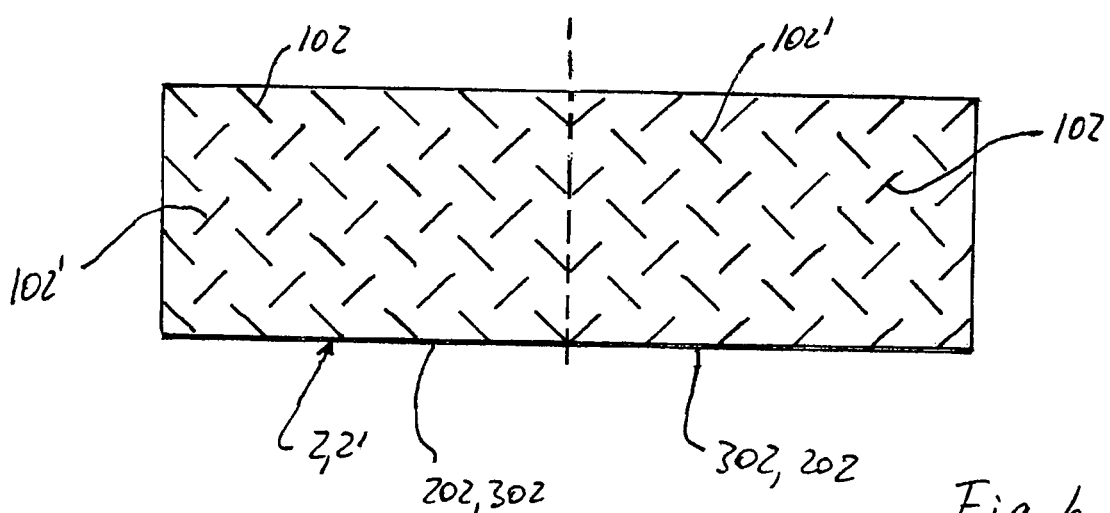
FIG. 6 shows the first and second sheets of FIGS. 4 and 5 in a superimposed position.

FIGS. 4 to 6 show an alternative cut pattern different from the embodiment of FIGS. 1 to 3. In this case, the cuts 102 and the cuts 102' are oriented in two transverse, non parallel directions.

The cuts 102 of the sheets may have a limited and predetermined length, there being provided, like in the pattern of FIGS. 1 to 3, a row of cuts aligned along one or more or all axes of the set of parallel axes, which defines the cut arrangement. Hence, the cuts have a limited length and are separated by cut-free regions 402.

The cut pattern selected for the two halves of the sheet 2 may also include cut-free regions and, besides combining the cut arrangement patterns, it may include offset cut-free regions for the cuts of two adjacent sheets 2, like in the embodiment of FIGS. 1 to 3.

According to a first method for fabricating the pack 301 of sheets, the sheets 2, 2' are coated with a layer of insulating varnish, denoted 4 [NOT CURRENTLY SHOWN IN FIGURES}, which additionally has the function of an adhesive to bond together the sheets 2, 2' of the pack. Therefore, the sheets 2, 2' are varnished before being superimposed to form the pack as described above, and then the pack is hot or cold pressed. The sheets may advantageously have centering or alignment holes for the insertion of centering or alignment pins (not shown in detail). The pack of sheets may be formed separately and fitted onto the massive layer 201 of the pole pieces 1 or the pack may be formed directly on the massive layer 201 of the pole pieces 1, which has, in this case, a supporting function and may have centering and/or alignment pins or centering and alignment holes for the insertion of said pins.

According to another method for fabricating the pack 301 of sheets, a layer of glue is used instead of the varnish. The layer of glue may be provided as adhesive films or may be applied, for instance spread, sprayed or the like, on the face of at least one sheet (2, 2'). After superimposing the sheets, the latter may be hot or cold pressed.

According to yet another method of fabricating the pack of sheets, a thermosetting adhesive layer is disposed between the sheets. This layer may be provided as a film, or applied by spreading, brushing, spraying, etc. Once the pack of sheets is formed with interposed thermosetting adhesive layers, the pack is hot and vacuum pressed to activate the thermosetting adhesive.

As a thermosetting adhesive, advantages are obtained by using foils of a material known as vetronite, which is widely used in the manufacture of printed circuit headers.

A suitable material is, for instance, the material named PRGEP84, type 1080, sold by DRITRON SPA, whose characteristics are listed in www.ditronlaminati.com.

In the embodiment of FIGS. 4 to 6, unlike the one of FIGS. 1 to 3, the cut-free regions 102 which separate the cuts aligned on the same axis are coincident with the cuts 102' of the adjacent sheet 2, and the cuts 102 of the underlying sheet never intersect the cuts 102' of the directly adjacent, underlying sheet. In this embodiment, the cuts 102 of two adjacent sheets are oriented in transverse, particularly orthogonal directions.

FIGS. 7 to 12 show, like the previous embodiments, two additional cut patterns for use on the sheets according to the invention.

Like in the previous embodiments, the sheets are divided into two halves, preferably symmetrically to a central overturning axis, the patterns of cuts 102 being formed or simply positioned in different manners on the two halves so that cuts are offset when the pack of sheets is formed, by placing the sheets alternately in one position and in an overturned position according to said axis.

Figure 7:
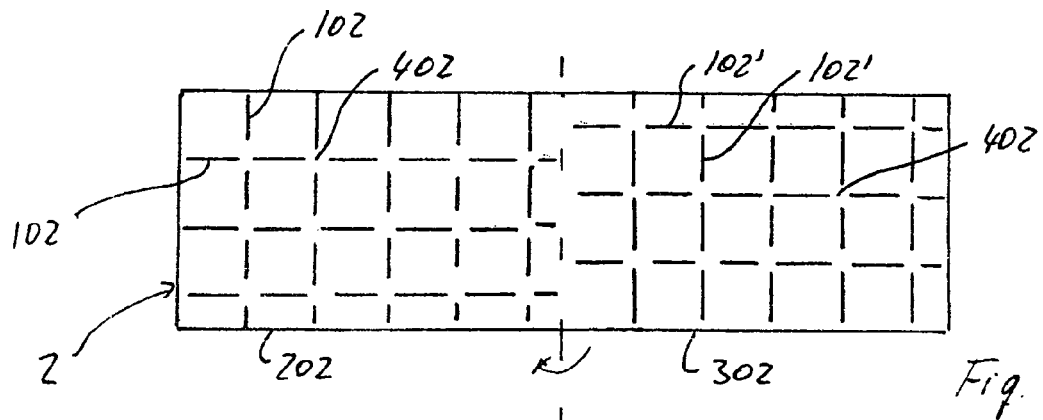
FIG. 7 shows a plan view of a first sheet comprising an another alternative pattern of cuts.
Figure 8:
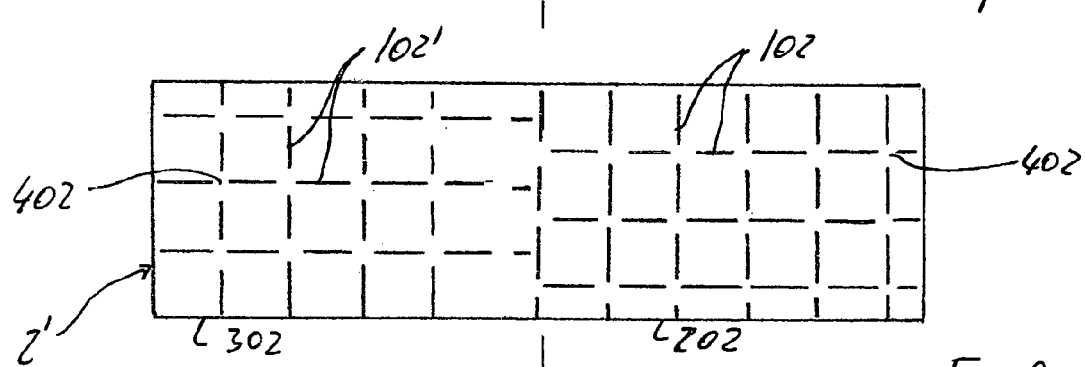
FIG. 8 shows a plan view of a second sheet in the overturned position.

In the cut patterns shown in FIGS. 7 and 8, the regions 202 and 302 of the sheets 2, 2' are divided by cuts oriented along two sets of parallel axes, the directions of the axes of the two sets being transverse, particularly perpendicular. The cuts are not continuous but broken at intersections. Hence, the sheet is divided by a grid of cuts 102 into a plurality of adjacent polygonal, particularly square portions, separated by the cuts and joined together by bridges of material at the corners of squares, as designated by 402.

Figure 9:
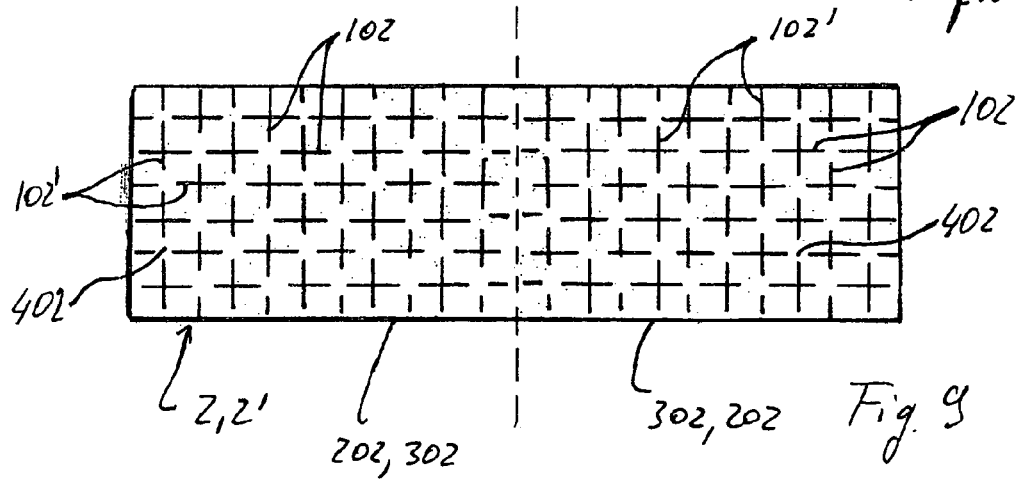
FIG. 9 shows the first and second sheets of FIGS. 7 and 8 in a superimposed position.

In the embodiment of FIGS. 7 to 9, the difference between the cut arrangements of the two halves 202 and 302 of the sheets is obtained by offsetting the position of the grid of cuts 102 to a predetermined extent along both directions of the sets of cut positioning axes.

As is apparent from FIG. 9, which shows two superimposed sheets 2,2', according to the above embodiment, as well as the position and orientation of the cuts 102' of the underlying sheet which are not actually visible, cuts intersect in this pattern.

If desired, the cuts may be also completed at corners, where the bridges of materials 402 are provided. If these bridges are sufficiently small, they may be cut off even with the pack of sheets in the assembled condition. This operation, that may be performed, for instance, by laser cutting, causes the full separation of the polygonal portions. However, the hole that cuts off the bridges of material between polygonal portions in one sheet, produces a hole in the material of the polygonal portion coincident with the bridge of material 402. This hole causes no operation problem.

Figure 10:
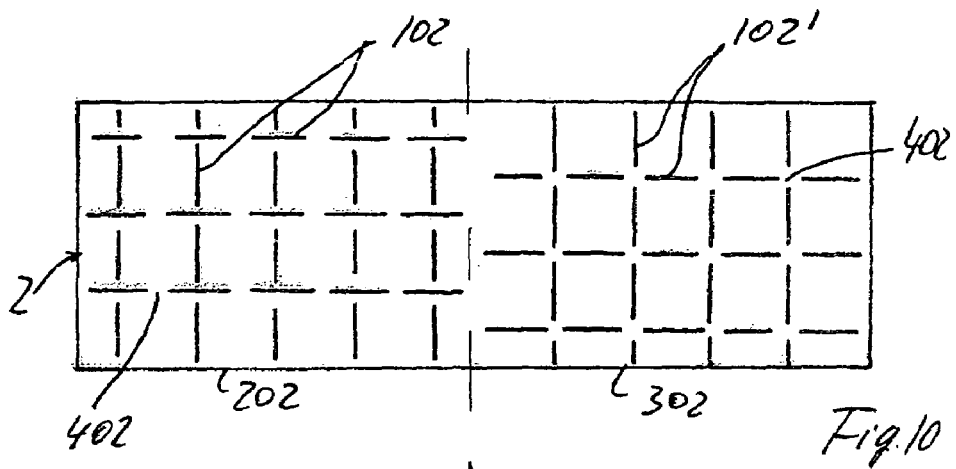
FIG. 10 shows a plan view of a first sheet comprising an still another alternative pattern of cuts.
Figure 11:
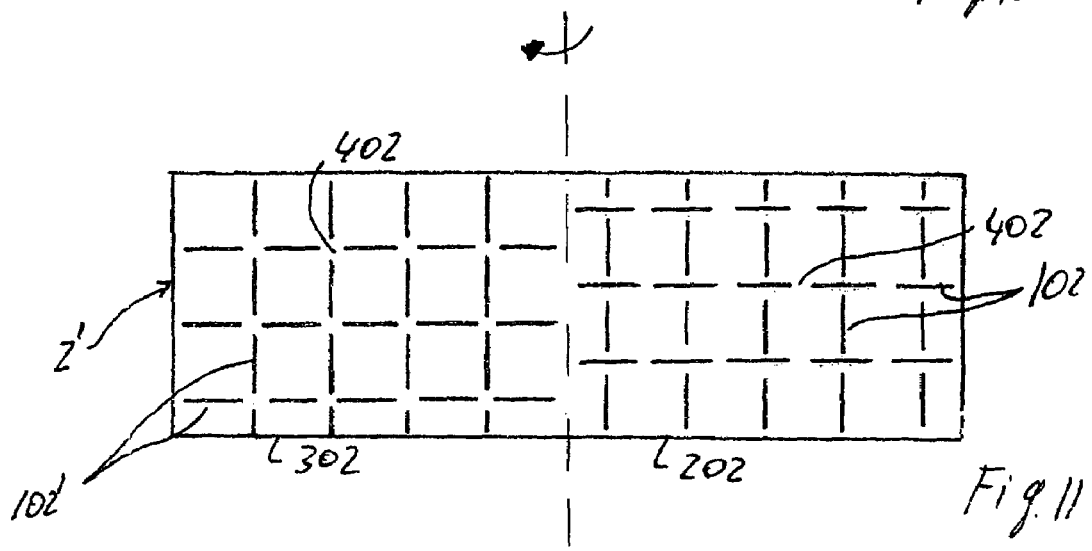
FIG. 11 shows a plan view of a second sheet in the overturned position.
Figure 12:
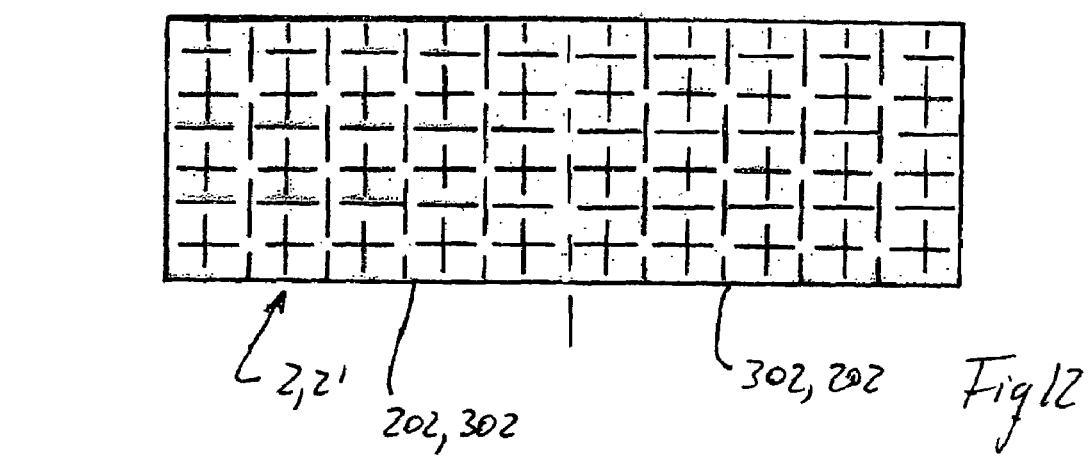
FIG. 12 shows the first and second sheets of FIGS. 10 and 11 in a superimposed position.

The embodiment of FIGS. 10 to 12 differs from the previous embodiment in that the pattern on the portion 302 of the sheet 2 is not obtained by simply translating the pattern of the portion 202 in two perpendicular directions. So, no grid is formed like in the portion 302, but the cuts, having different, particularly perpendicular directions, are disposed in two perpendicular directions and in such positions as to intersect.

The final pattern of cuts in the superimposed condition is not different from the one of the embodiment as shown in FIGS. 7 to 9, however the cut arrangement is different at least for the portion 302 of the sheet.

Figure 13:
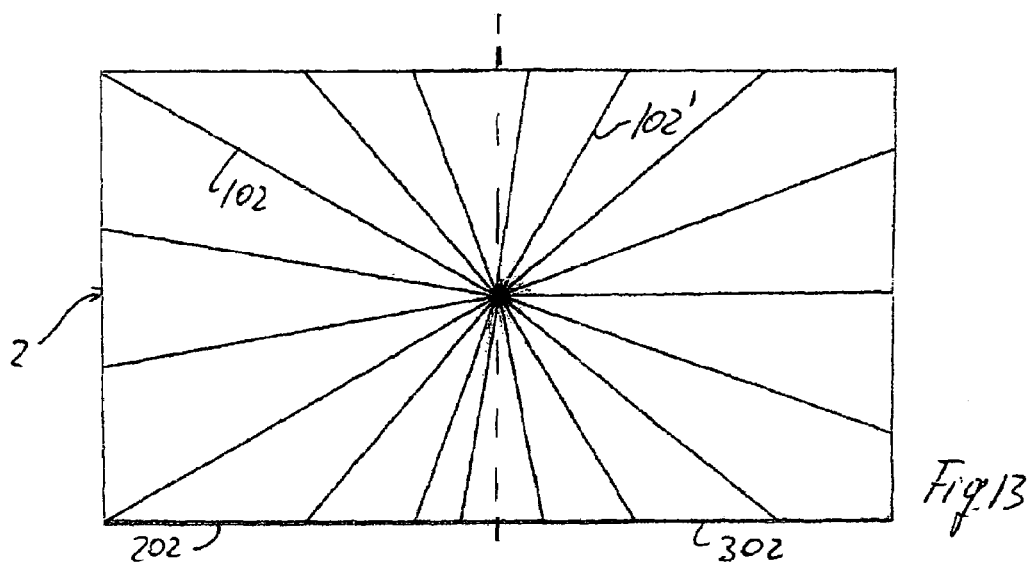
FIG. 13 shows a plan view of a first sheet comprising a radial pattern of cuts.
Figure 14:
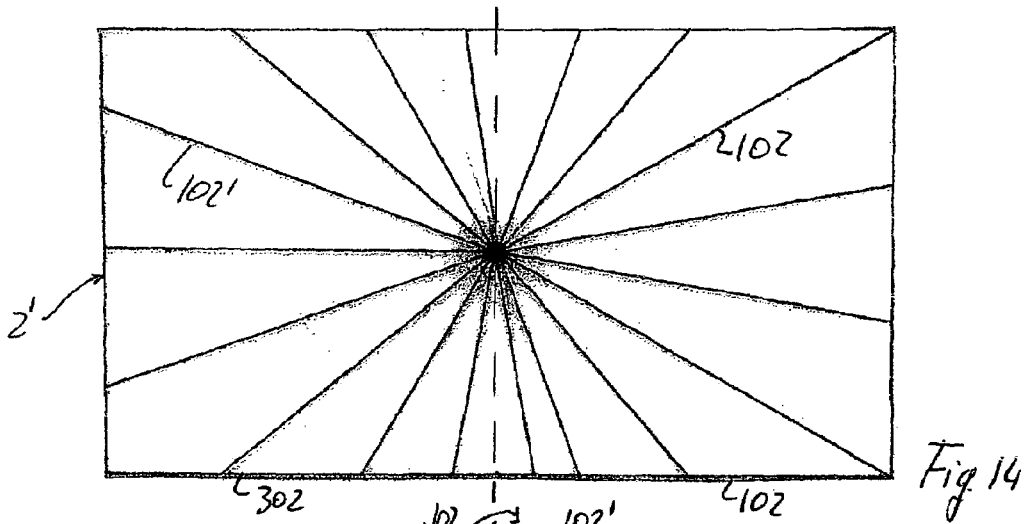
FIG. 14 shows a plan view of a second sheet in the overturned position.
Figure 15:
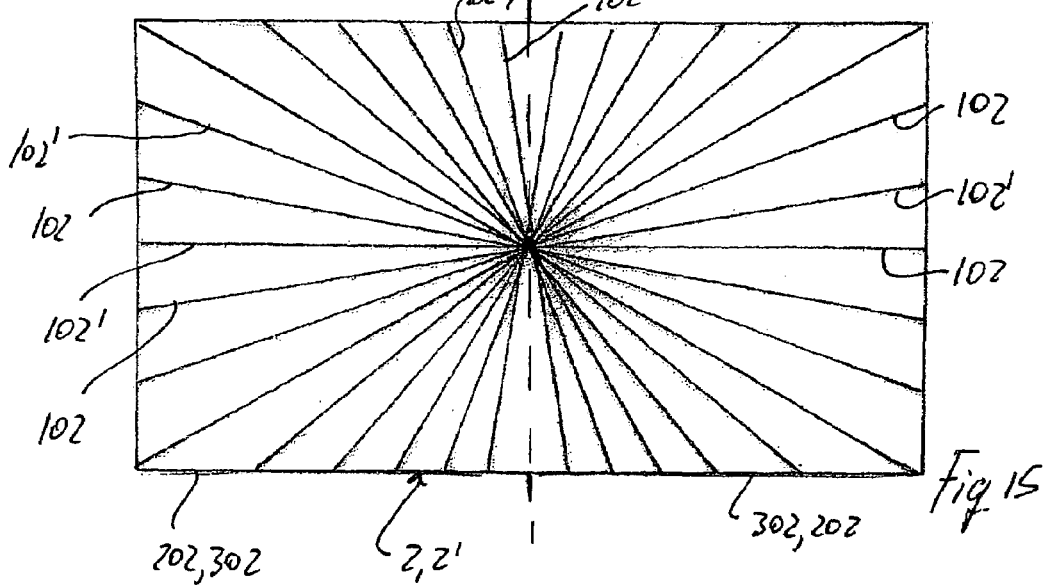
FIG. 15 shows the first and second sheets of FIGS. 13 and 14 in a superimposed position.

FIGS. 13 to 15 show a further embodiment, wherein the cuts 102 extend radially from the center of the plan view of the sheets 2.

For the sake of simplicity, FIG. 13 only shows one order of radial and continuous cuts 102. Nevertheless, in order to improve the sheet strength, each cut 102 may be formed discontinuously, i.e. comprising a row of limited-length cuts, separated by bridges of material, along each radius.

Two radial sets of cuts may be also provided, a first set extending, with continuous or discontinuous cuts, to a certain distance from the periphery, and a second radial set, angularly interleaved with the former, forming a ring of peripheral cuts, which extend from the end of the first set of cuts to the peripheral portion of the sheet. The radial cuts of the peripheral set may be also arranged to start closer to the center as compared with the outer radial end of the cuts of the first set.

In this embodiment, the two halves 202 and 302 of the sheet 2 have radially oriented, angularly equally spaced cuts. The angular pitch of the individual cut positioning radiuses is of 20°. Such angular distance is maintained for all cuts, except the cuts immediately adjacent to the line that divides the sheets into the two halves 202 and 302. In fact, the cuts of the half 302 are all rotated by 10° forward with respect to the last adjacent cut 102 on the first sheet half 202. The resulting sheet is as shown in FIGS. 13 and 14, i.e. by using the same sheet pack forming arrangements, an angular offset is provided between the radial cuts of the underlying sheet and the sheet laying over the latter in an overturned position. FIG. 15 shows the position of the combined cuts of the two sheets. By overturning the overlying sheet, an interleaved arrangement of the radial cuts of the two adjacent sheets is obtained. The cuts of one sheet are disposed in a centered position with respect to two cuts of the other sheet, with no coincidence of cuts being generated in the pack of sheets.

Here, the advantage as regards construction consists in that the sheet is not required to be rotated, but simply has to be overturned before laying it over the top sheet of the pack. In order to cause the cuts to be offset, no mutual rotation of the sheets is required, which would be only possible by using circular sheets.

Furthermore, by properly positioning the centering pins, the cuts are properly offset by simply alternately overturning the sheets as they are placed on the pack being formed, and fitting them onto the centering pins.

Regarding all the embodiments as shown in the figures, relatively simple arrangement patterns have been proposed, for the sake of simplicity, however the principle of this invention includes any type of arrangement pattern.

Figure 16:
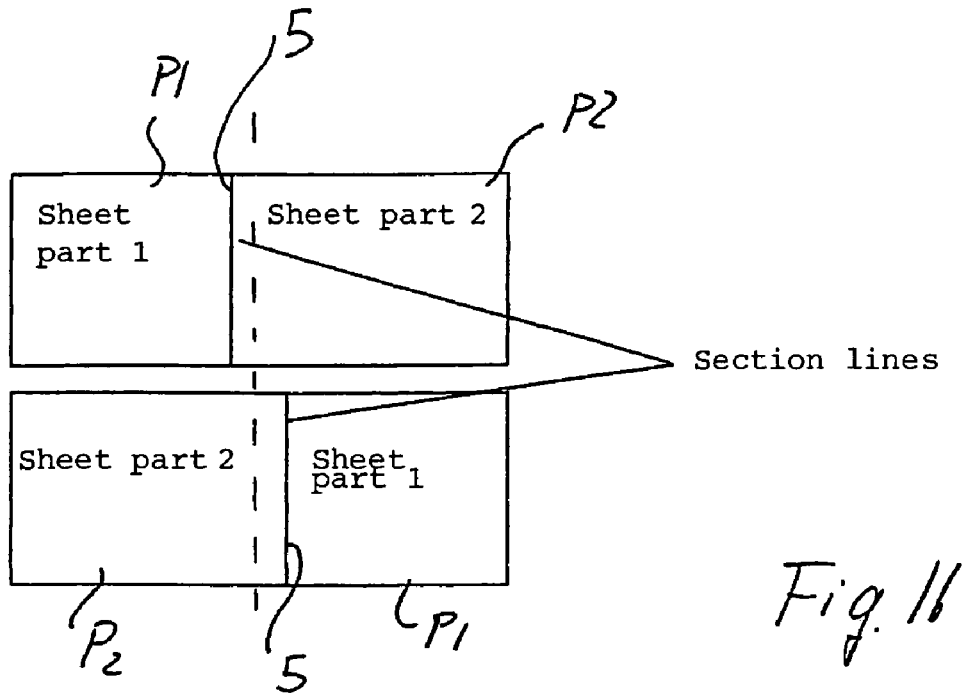
FIG. 16 shows a sheet formed by two or more separate adjacent parts in accordance with a second embodiment of the invention.
Figure 18:
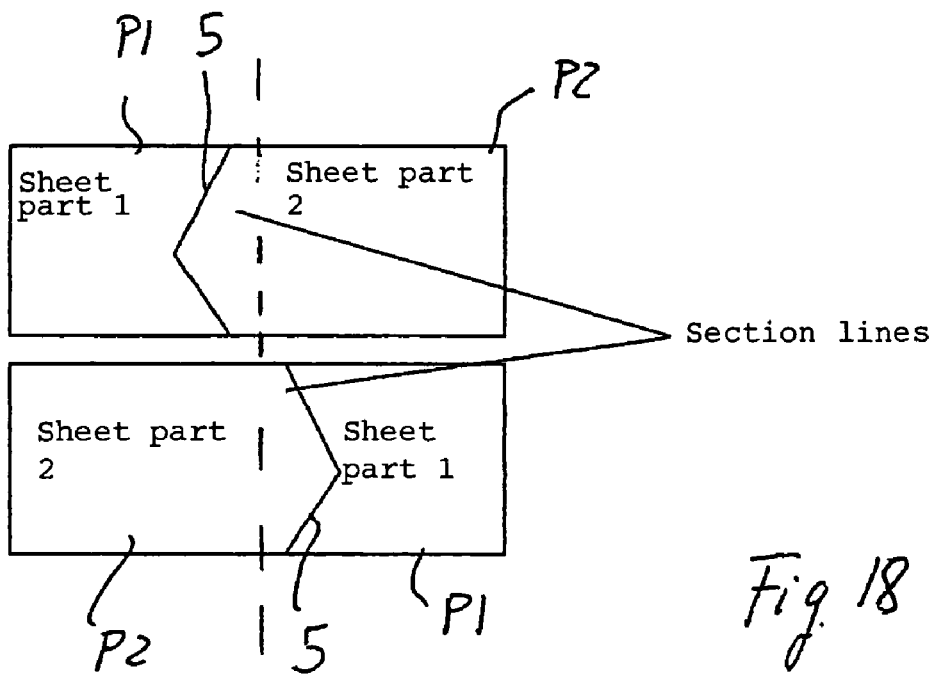
FIG. 18 shows a sheet formed by two or more separate adjacent parts with another alternative parting line.
Figure 21:
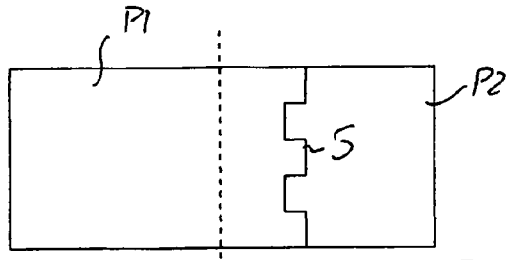
FIGS. 21 to 25 show different patterns of the line that separates a sheet into two parts according to the second embodiment of the invention.
Figure 22:
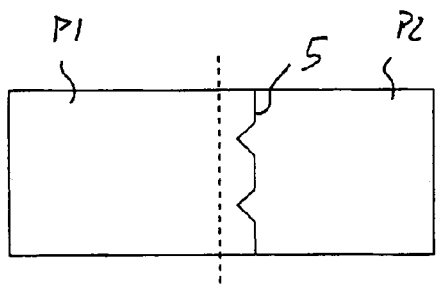
Figure 23:
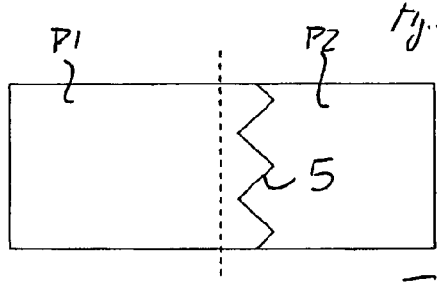
Figure 24:
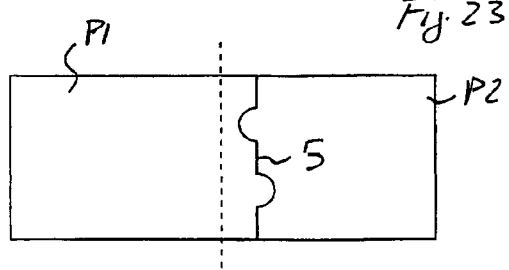
Figure 25:
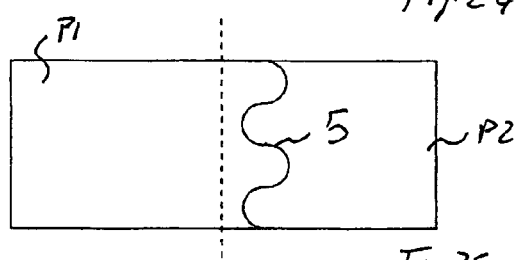
Figure 17:
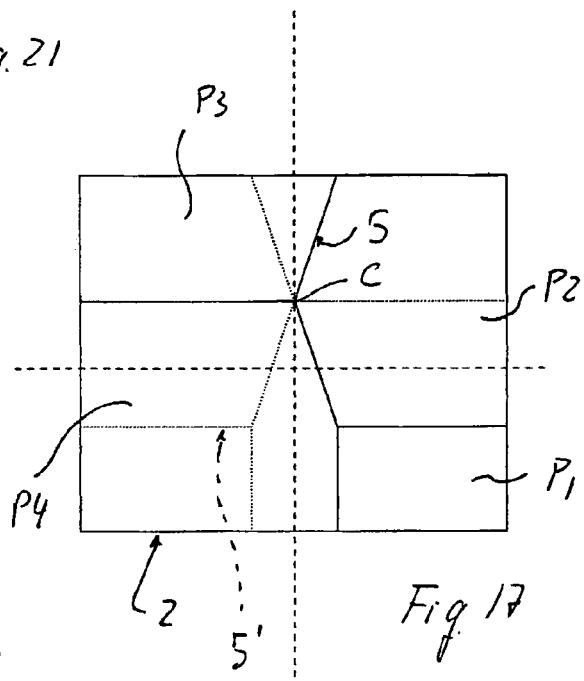
FIG. 17 shows a sheet formed by two or more separate adjacent parts with an alternative parting line between the parts.

FIGS. 16 and 17 show another advantageous feature, that may be provided in combination with any sheet described in the previous embodiments of FIGS. 1 to 15. In FIGS. 16 to 18, cut arrangement patterns have been omitted from the sheets.

FIG. 16 shows the principle of this additional feature in the simplest embodiment. According to the invention, each sheet 2, 2' may be composed of two parts P1, P2 separated along a predetermined parting line, which parting line is in such position and has such an orientation relative to the peripheral shape of the sheets that, as the sheets are stacked in alternately overturned positions, as described in greater detail above, the parting lines between the two sheet parts are disposed in non coincident positions and/or in such a manner as to avoid or minimize intersections.

Given a sheet as described above with reference to FIGS. 1 to 15, wherein the cut arrangement pattern is differentiated for each sheet half, the parting line is selected in such position and with such an orientation as to coincide neither with the center sheet overturning axis and/or with a center axis parallel to an overturning axis, nor with a cut 102, 102' positioning axis.

FIG. 16 shows two superimposed sheets 2 and 2', one in a first position and the other in a second position, the latter corresponding to an overturned superimposed position of said second sheet 2' on the former 2. The parting line 5 is eccentric to the center overturning axis, which is outlined by a dashed line. As is apparent from the above, by overturning the sheet, the eccentric parting line 5 of the sheet 2 is not coincident with the parting line 5 of the overturned sheet 2', whereby the pack of sheets is not divided, along a perpendicular plane of the pack of sheets, into two packs of sheets, continuously extending through the pack.

Obviously, the simplest embodiment of FIG. 16 may be improved by providing sheets separated into three or more parts, either in one direction or in both directions.

FIG. 17 shows an example of arrangement of parting lines in a sheet composed of four parts, by providing a complex and branched parting line 5. In this case, a minimum number of intersections cannot be avoided, particularly the point denoted C. The dotted line, denoted 5', outlines the combined parting line obtained in the overturned and superimposed sheet, whereas the dashed lines outline the two center orthogonal axes, referred to the plan view of the whole sheet. The whole sheet 2 is composed in this case by four smaller parts P1, P2, P3, P4. The above mentioned intersections, and in this specific case the point C, are such as to generate a point-like slot in the pack of sheets, which continuously extends across the whole pack. This drawback does not affect significantly the suppression or drastic reduction of undesired currents produced in the pole pieces.

The advantage of this embodiment consists in that it allows to design relatively inexpensive magnetic structures which are not subjected to the size restrictions imposed by metal sheet manufacturers. It shall be considered that, while these construction parts are relatively large and not complex from the mechanical point of view, the use thereof in Nuclear Magnetic Resonance Imaging apparatuses requires size tolerances that are unusual for the field of metal production. Also, the material used for the sheets is often a special alloy that is never available in the large sizes required by Magnetic Resonance Imaging apparatus manufacturers. The provision of sheets composed of at least two or more parts also allows to use special materials, without forcing the Magnetic Resonance Imaging apparatus manufacturer to require special, high cost productions.

Finally, FIG. 18 shows an improvement of the principle as shown in FIGS. 16 and 17. Here, the parting line 5 is not straight but may have either a rounded or a polygonal profile. Particularly, it has at least two partial segments which form a certain angle. This provides a certain simplified mutual centering and alignment action between the two sheet parts separated by said line 5. Here again, the sheets may be composed of three or more parts.

The non-straight parting line may have several different profiles, e.g. a sinusoidal profile or a toothed profile, with square, triangular, rounded, circular teeth, etc. still considering that the envelope of the parting line shall always preferably occupy a surface band not coincident with the center overturning axis or with the center axis parallel to the overturning axis, but possibly intersecting the cuts or partly coincident with a cut. FIGS. 21 to 25 show a few non limiting examples of different possible embodiments of the parting line. The dashed line is the center axis of the sheet, parallel to or coincident with the overturning axis of the sheets for forming the pack according to this invention.

Figure 26:
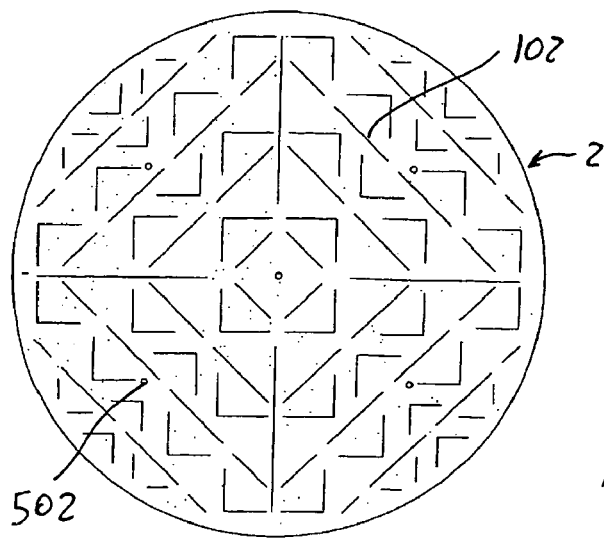
FIG. 26 shows a plan view of a first sheet for use in a magnet structure according to a third embodiment of the invention.
Figure 27:
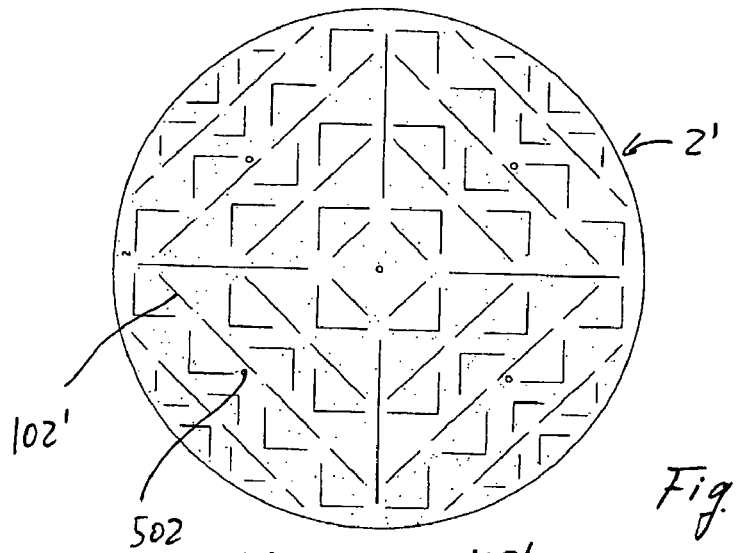
FIG. 27 shows a plan view of a second sheet for use in a magnet structure according to a first embodiment of the invention.
Figure 28:
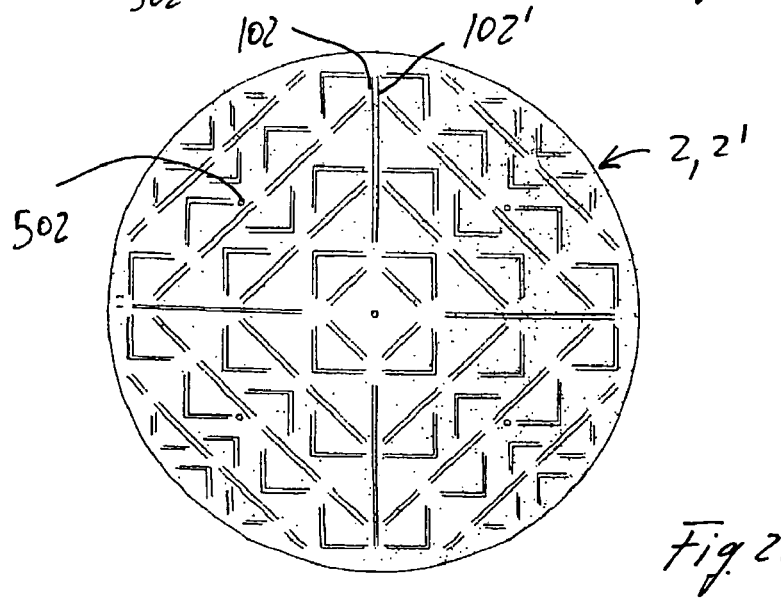
FIG. 28 shows the first and second sheets of FIGS. 26 and 27 in a superimposed position according to a third embodiment of the invention.

In FIGS. 26 to 28 a further embodiment of the sheets for the magnet structure according to the invention are shown. According to this embodiment, two kind of sheets provided with a pattern of passing through cuts are provided. The sheets has been given the same numeral as in the FIGS. 1 to 4, namely 2, 2'. In this example each sheet 2, 2' is provided with an identical pattern of cuts 102. However in a different manner as in the examples of FIGS. 1 to 4, the sheets are not provided for being superimposed by turning them upside and downside for each layer but two sheets 2, 2' are provided having the identical and congruent peripheral shape and having an identical pattern of cuts 102 which patter has a different position relatively to the sheet shape. According to this embodiment the pattern of cuts on sheet 2' is provided on the second sheets 2' in a shifted way with respect to the position of the same pattern of cuts provided on the first sheet 2, according to two directions which are transverse one with respect to the other, particularly orthogonal one to the other and which are parallel to the plane defined by the sheet. Thus superimposing sheet 2' on sheet 2, the cuts of the pattern of the two sheets will not coincide and will be provided laterally staggered relatively to one another as illustrated in FIG. 28. Forming a pack of sheets by alternatively superimposing sheets of the first kind 2 on sheets of the second kind 2' the pack of sheets will never show coincident cuts 102, 102' of two adjacent sheets.

Although a circular peripheral shape of the sheets is not mandatory, if the shape of the sheets do not have a rotational symmetry, the alignment of the sheets in the pack can be made by referring to the shape of the peripheral borders. When the symmetry of the of the sheets is a rotational one it is preferred to provide both first and second kind of sheets 2, 2' with identical pattern of centering through holes 502 which pattern have the same position for both kinds of sheets 2, 2' and fall congruent when the sheets are superimposed. This helps in correctly aligning and orienting the two kind of sheets in order to avoid crossing of the cuts 102, 102' of the two kinds of sheets.

Having chosen to shift the pattern of cut on one sheet 2' as compared to the same pattern of cuts on the other kind of sheets 2 along two orthogonal directions allows to provide a pattern of cuts which can show cuts oriented according to these two directions and cuts which are oriented at 45° or 135° or 225° or 315° with respect to the said two orthogonal directions.

Many kinds of patterns are possible which will lead to the result of efficiently limiting or suppressing eddy currents induced in the pole pieces of the magnet structure.

The present example shows a particular pattern which is formed by providing concentric squares paths having a constant length increase from one square to the other inscribed within a circular peripheral edge of the sheets. The concentric squares have a common center which is displaced according to two directions relatively to the center of the circular shape of a first sheet kind 2 while the center of the concentric squares are displaced in the same two directions but on the opposite side of the centre of the circular sheet on the second kind of sheets 2'. Cuts are provided along the sides of the concentric squares, the cuts being discontinuous in order to form material connections between the surface of the sheet enclosed by the cuts on a square path and the material of the sheet outside the said square path. Thus superimposing the two sheets each square path on a first kind 2 of sheet and thus the cuts provided along the said path will be placed laterally sifted relatively to the same square path and the cuts provided there on of the second kind of sheets. At the annular surfaces of the sheets provided between two following square path along which the cuts are provided further L shaped cuts are provided which are oriented according to the alignment of a further concentric square path for the cuts which is enclosed by the innermost one and has a 90° rotated orientation. Further smaller L cuts are also provided to fill in a regular manner the last zones of the sheets which are still free of cuts.

Although the above described embodiment provides two different kind of sheets the embodiment could be also designed in order to be obtained by only one kind of sheet having a different positioning of the pattern of cuts onto different halves, whereby the pattern of cuts is identical for both halves of the sheet but the one on a first half is shifted along two orthogonal directions on the other half with respect of the position of the pattern of cut on the first half.

All the other features disclosed for the previous embodiments and which can apply also to the present embodiment has to be considered as provided in any combination or subcombination with this last embodiment.

Providing different kinds of sheets with shifted pattern of cuts according to the above described example of FIGS. 26 to 28 gives the opportunity to increase the number of kinds of sheets. Thus for example a sequence of N different sheets with N integer can be provided each one having an identical pattern of cuts which for each one of the N sheets has been displaced for a given distance along the same two directions relatively to the preceding sheet in the sequence of sheets.

N can be a rational fraction of the total number of sheets needed for forming the pack of sheets thus an alternate superimposing of the N different kind of sheets in the pack corresponding to a recursive superimposing of the sequence of sheets is needed. N can be also equal to the total number of sheets provided in the pack of sheets so that non repetition of the sequence of the N different kind of sheets is needed for forming the pack of sheets.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A magnet structure for Nuclear Magnetic Resonance imaging apparatus, comprising:
   at least two opposing magnetic pole pieces located at a certain distance from each other and which delimit an imaging region;
   wherein the pole pieces are formed by at least one massive layer of a magnetically permeable material, and at least one layer of magnetically permeable material comprising a pack of superimposed sheets or foils, electrically insulated from each other, each sheet having cuts arranged over the surface of the sheet in positions that are at least partly non coincident with the cuts of at least one, or both adjacent sheets, and
   wherein each of the magnetically permeable sheets or foils comprises:
   a first face; and
   a second face; and
   wherein the cuts arranged over the surface of the sheet or foil have a width and length and are so arranged on each sheet, that the cuts of a sheet or foil are offset and not coincident with respect to the cuts of an adjacent sheet or foil, when the adjacent sheet is laid over the previous sheet in an overturned position, with the first face turned toward the first face of the first sheet or with the second face of said adjacent sheet turned toward the second face of the first sheet, regardless of the relative angular orientation of the sheets with respect to each other.

2. A magnet structure as claimed in claim 1, wherein patterns of the cuts on one of the sheets have a repeated, orderly, and/or recurring geometric cut arrangement, the cuts of each halves of the sheet being formed according to a same arrangement pattern which, in the second half of the sheet, is offset to a certain extent in one or two directions subtending the plane formed by the sheet and/or angularly also in a possible direction of rotation or combination of said displacements, with respect to the periphery of the second sheet half, relative to the position in the arrangement pattern of the first half of the sheet, such that the cuts of two superposed sheets, adhering by their first faces and their second faces, coincide with cut-free portions and/or have a small number of intersection points between the cuts of the two superposed sheets.

3. A magnet structure as claimed in claim 2, wherein when two adhering sheets are superimposed, one of the two sheets is overturned with respect to the other sheet, such that the first half and the second half of a sheet lie over the second half and the first half respectively of the other sheet and the cuts of said first and second halves of the one sheet are disposed coincident with the cut-free portions of said second and first halves of the underlying sheet and vice versa.

4. A magnet structure as claimed in claim 1, wherein the cuts are disposed along parallel axes which form a set of parallel axes, the sets of axes on the first and on the second half of the sheet being oriented parallel to each other and to an overturning axis, and there being provided a distance of the first axis of each set of axes from the center axis of the sheet, which is parallel to or coincident with the overturning axis, said distance being different for the sets of axes on the first half and on the second half of the sheet respectively.

5. A magnet structure as claimed in claim 4, wherein the cuts are continuous along the corresponding positioning axis of the set of parallel positioning axes.

6. A magnet structure as claimed in claim 4, wherein the cuts are discontinuous along the corresponding positioning axis of the set of parallel positioning axes and form whole regions or bridges of sheet material.

7. A magnet structure as claimed in claim 1, wherein the sets of cut positioning axes on the two halves of the sheet have an inclined, symmetrically divergent or convergent orientation, for the first and the second halves of the sheet with respect to the center axis of the sheet, which is parallel to or coincident with the sheet overturning axis, and wherein
the intersection points of the set of parallel positioning axes on the first half of the sheet with said center axis being provided in intermediate positions between the intersection points of the set of parallel positioning axes of the second sheet half of the sheet.

8. A magnet structure as claimed in claim 7, wherein the intersection points of the two sets of parallel cut positioning axis on the first and second halves of the sheet are interleaved and equally spaced along the center axis, which is parallel to or coincident with the overturning axis.

9. A magnet structure as claimed in claim 1, wherein the sets of cut positioning axes on the two halves of the sheet have an inclined orientation with respect to the center axis of the sheet, which is parallel to or coincident with the sheet overturning axis, the intersection points between the set of parallel positioning axes on the first half of the sheet and said center axis being situated in intermediate positions with respect to the intersection points between the positioning axes of the set of parallel positioning axis of the second half of the sheet and said center axis, and each cut along each positioning axis being discontinuous and forming an unbroken portion of the sheet, the succession of the unbroken sheet portions and of the cut parts along the positioning axes being inverted from the first half to the second half of the sheet, whereas the pitch of the cuts and unbroken portions along each positioning axis is such that, when the first half of the sheet is overturned against the second half of the sheet, the cuts of the first half of the sheet intersect along each positioning axis the cuts of the second half of the sheet at unbroken portions, and vice versa.

10. A magnet structure as claimed in claim 1, wherein on each sheet half, the cuts are arranged along two intersecting sets of parallel positioning axes, an unbroken portion of the sheet or a bridge of material being provided at each intersection point between each axis of one set of axes, and each axis of the other set of axes, and the two sets of intersecting parallel positioning axes being offset in the second half of the sheet relative to the corresponding set of the first half of the sheet, such that, when the second half of the sheet is overturned on the first half of the sheet about a center axis parallel to the overturning axis or coincident therewith, the unbroken intersection portions of the cuts along intersecting sets of parallel positioning axis of one half of the sheet fall within portions of the sheet of the other half of the sheet, which are delimited by the cuts.

11. A magnet structure as claimed in claim 10, wherein the intersecting sets of positioning axes have axes inclined with respect to the overturning axis, in the same orientation for the two sheet halves or with different, symmetrical orientations with respect to a center axis parallel to and/or coincident with the overturning axis.

12. A structure as claimed in claim 10, wherein one set of parallel cut positioning axes on both sheet halves is parallel to the overturning axis.

13. A structure as claimed in claim 10, wherein one set of parallel cut positioning axes on both sheet halves is perpendicular to the overturning axis.

14. A structure as claimed in claim 10, wherein on at least one half of the sheet, the two intersecting sets of positioning axes are disposed in such a manner that the unbroken sheet portions between cuts along the axes of a first set are situated in intermediate positions between two positioning axes of the second set, whereas the cuts of the first set intersect the axes of the second set coincident with the unbroken portions along the axes of said second set.

15. A structure as claimed in claim 1, wherein the cuts are disposed along positioning axes in radial arrangements from a defined center of the sheet, an identical angular distance being provided between individual radial lines along which cuts are provided, whereas a portion of said radial arrangement of cuts being provided on each of the two sheet halves, the portion of radial cuts of the second sheet half being rotated with respect to the portion of the radial cuts of the first sheet half, with reference to said center, to such an extent that when the second half of the sheet is overturned on the first half of the sheet, the cuts of one of the two halves are in intermediate positions between the cuts of the other half.

16. A magnet structure as claimed in claim 15, wherein the center of the radial arrangement of cuts is the same for both halves of the sheet and is coincident with a center axis, parallel to or coincident with the overturning axis and/or the geometric center of the sheet.

17. A magnet structure as claimed in claim 15, wherein the radial cuts on the sheet are combined with a peripheral ring of cuts, which is interleaved with the former, the cuts of the peripheral ring being also disposed on the first and second halves of the sheet and the cuts of the second sheet half being angularly shifted with respect to those of the first sheet half, like the radial cuts.

18. A magnet structure as claimed in claim 15, wherein each sheet is composed of at least two adjacent sheet parts, separated by a parting line, said parting line being provided in eccentric position and/or orientation with respect to the center axis parallel to or coincident with the overturning axis, and anyway in such position and/or orientation that the parting lines between the parts of two superimposed sheets do not coincide, and intersection points therebetween are avoided or minimized.

19. A magnet structure as claimed in claim 18, wherein the parting line between the two or more parts of the sheet extends in a cut-free portion, so that said parting line does not intersect any cut on the sheet and/or possibly any cut on one or two adjacent sheets.

20. A magnet structure as claimed in claim 18, wherein the parting line is a polygonal line, a toothed line with square, triangular or trapezoidal teeth, a curved line, or a combination of said lines.

21. A magnet structure as claimed in claim 18, wherein the parting line is a polygonal line having transverse branches and divides a sheet into four separate parts.

22. A magnet structure as claimed in claim 18, wherein the sheets and/or the sheet parts have holes at predetermined coincident positions for engagement on alignment and centering pins during the assembly of the pack of sheets.

23. A magnet structure according to claim 1, wherein the sheets have non rotational symmetry.

24. A magnet structure according to claim 1, wherein the sheets have rotational symmetry.

25. A magnet structure according to claim 1, wherein the sheets are provided with one, two or more centering through holes which are distributed over the surface area of the sheets according to a pattern which is identical for each sheet and which patter has the same position on each sheet in such a way that superimposing the sheets for forming a pack of sheets the centering holes are coincident.

26. A magnet structure according to claim 1, wherein the sheets have identical shape and dimensions.

27. A magnet structure according to claim 1, wherein the pattern of cuts is formed by rectangular concentric ideal paths along which paths several cuts are provided at a certain distance one from the other for forming material bridges between the sheet zones inside a rectangular path and outside the said rectangular path.

28. A magnet structure according to claim 1 wherein the pattern of cuts provides cuts having orientations parallel to both the two directions of displacement of the pattern of cuts between two different kinds of sheets and also cuts oriented along paths having at an angle of 45°, 135°, 225°, or 315° with respect to the said two orthogonal directions of displacement.

29. A magnet structure for Nuclear Magnetic Resonance imaging apparatus, comprising:
   at least two opposing magnetic pole pieces located at a certain distance from each other and which delimit an imaging region;
   wherein the pole pieces are formed by at least one massive layer of a magnetically permeable material, and at least one layer of magnetically permeable material comprising a pack of superimposed sheets or foils, electrically insulated from each other, each sheet having cuts arranged over the surface of the sheet in positions that are at least partly non coincident with the cuts of at least one, or both adjacent sheets, and
   wherein each of the magnetically permeable sheets or foils comprises:
   a first face; and
   a second face; and
   wherein the cuts arranged over the surface of the sheet or foil have a width and length and are so arranged on each sheet, that the cuts of a sheet or foil are offset and not coincident with respect to the cuts of an adjacent sheet or foil, when the adjacent sheet is laid over the previous sheet in an overturned position, with the first face turned toward the first face of the first sheet or with the second face of said adjacent sheet turned toward the second face of the first sheet;
   wherein each sheet is divided into two halves along an axis parallel to or coincident with a sheet overturning axis, about which each successive sheet is overturned by 180° relative to the adjacent preceding sheet of the layer of sheets of each pole piece, there being provided an identical pattern of cuts for all sheets, which pattern differs in the arrangement, orientation, length, or width of the cuts in the two halves of each sheet such that, when two sheets are superimposed in a mutually overturned or reversed condition, with the first faces or the second faces of said two superposed sheets in contact with each other, the cuts of a sheet are disposed in offset positions with respect to the cuts of the overlying sheet in both halves of said adjacent sheets.

30. A magnet structure for Nuclear Magnetic Resonance imaging apparatus, comprising:
   at least two opposing magnetic pole pieces located at a certain distance from each other and which delimit an imaging region;
   wherein the pole pieces are formed by at least one massive layer of a magnetically permeable material, and at least one layer of magnetically permeable material comprising a pack of superimposed sheets or foils, electrically insulated from each other, each sheet having cuts arranged over the surface of the sheet in positions that are at least partly non coincident with the cuts of at least one, or both adjacent sheets, and
   wherein each of the magnetically permeable sheets or foils comprises:
   a first face; and
   a second face; and
   wherein the cuts arranged over the surface of the sheet or foil have a width and length and are so arranged on each sheet, that the cuts of a sheet or foil are offset and not coincident with respect to the cuts of an adjacent sheet or foil, when the adjacent sheet is laid over the previous sheet in an overturned position, with the first face turned toward the first face of the first sheet or with the second face of said adjacent sheet turned toward the second face of the first sheet.

31. A magnet structure for Nuclear Magnetic Resonance imaging apparatus, comprising:
   at least two opposing magnetic pole pieces located at a certain distance from each other and which delimit an imaging region;
   wherein the pole pieces are formed by at least one massive layer of a magnetically permeable material, and at least one layer of magnetically permeable material comprising a pack of superimposed sheets or foils, electrically insulated from each other, each sheet having cuts arranged over the surface of the sheet in positions that are at least partly non coincident with the cuts of at least one, or both adjacent sheets, and
   wherein each of the magnetically permeable sheets or foils comprises:
   a first face; and
   a second face; and
   wherein the cuts arranged over the surface of the sheet or foil have a width and length and are so arranged on each sheet, that the cuts of a sheet or foil are offset and not coincident with respect to the cuts of an adjacent sheet or foil, when the adjacent sheet is laid over the previous sheet in an overturned position, with the first face turned toward the first face of the first sheet or with the second face of said adjacent sheet turned toward the second face of the first sheet, and wherein at least two of the sheets or foils are substantially identical to each other and are arranged next to each other with the first face of one sheet or foil turned toward the first face of the adjacent sheet or foil or with the second face of said adjacent sheet turned toward the second face of the first sheet.

* * * * *